US009766109B2

(12) United States Patent
Armstrong et al.

(10) Patent No.: US 9,766,109 B2
(45) Date of Patent: Sep. 19, 2017

(54) CAPACITIVE LIQUID LEVEL SENSOR (75) Inventors: Ian Armstrong, Hillsborough (GB); Michael Duffy, Crumlin (GB); Stephen Peter Fitzgerald, Crumlin (GB)

(73) Assignee: RANDOX LABORATORIES LTD., Crumlin, Co. Antrim (GB)

( * ) Notice: Subject to any disclaimer, the term of this patent is extended or adjusted under 35 U.S.C. 154(b) by 1017 days.

(21) Appl. No.: 13/821,846

(22) PCT Filed: Aug. 5, 2011

(86) PCT No.: PCT/GB2011/051488
§ 371 (c)(1),
(2), (4) Date: Sep. 25, 2013

(87) PCT Pub. No.: WO2012/032318
PCT Pub. Date: Mar. 15, 2012

(65) Prior Publication Data
US 2014/0007676 A1    Jan. 9, 2014

(30) Foreign Application Priority Data

Sep. 9, 2010  (GB) .................................. 1015009.2

(51) Int. Cl.
*G01F 23/26* (2006.01)
*G01F 25/00* (2006.01)
*H03K 17/955* (2006.01)

(52) U.S. Cl.
CPC .......... *G01F 23/261* (2013.01); *G01F 23/265* (2013.01); *G01F 23/266* (2013.01);
(Continued)

(58) Field of Classification Search
CPC .. G01F 23/265; G01F 23/266; G01F 25/0061; G01F 23/261; H03K 17/955; H03K 2217/94026
(Continued)

(56) References Cited

U.S. PATENT DOCUMENTS 4,970,468 A * 11/1990 Ishizawa ............... G01F 23/263
324/662
5,585,733 A * 12/1996 Paglione .................. G01B 7/02
324/676
(Continued)

FOREIGN PATENT DOCUMENTS

DE      3322657 A1    1/1985
EP      0175362 A2    3/1986
(Continued)

OTHER PUBLICATIONS

International Search Report and Written Opinion of PCT/GB2011/051488.
British Search Report of GB 1015009.2.

*Primary Examiner* — Hezron E Williams
*Assistant Examiner* — Marrit Eyassu
(74) *Attorney, Agent, or Firm* — Steptoe & Johnson LLP (57) ABSTRACT A capacitive liquid level sensor is provided comprising a capacitive probe having a capacitance and comprising a sensing tip wherein the capacitive probe is configured such that the capacitance of the probe changes when the sensing tip is exposed to liquid. A signal generator operates to supply an electrical signal alternating between a high and low state to the capacitive probe, the electrical signal being configured such that the probe is alternately charged and discharged when the signal is high or low respectively. A comparator operates to detect the magnitude of an electrical signal across the capacitive probe and provides a first output signal value when the detected signal magnitude is greater than a predetermined threshold value and a second output signal value when the signal magnitude is less than the threshold value. A timer operates to receive an output signal from the comparator and measures a time period starting when the comparator output signal transitions to the first output signal value and ending when the comparator output signal tran-
(Continued)

sitions to the second output signal value. Liquid detection means also operate to utilize the time period measured by the timer to determine if the sensing tip is exposed to liquid.

30 Claims, 7 Drawing Sheets

(52) U.S. Cl.
CPC ....... *G01F 25/0061* (2013.01); *H03K 17/955* (2013.01); *H03K 2217/94026* (2013.01)

(58) Field of Classification Search
USPC .......................................... 73/304 C
See application file for complete search history.

(56) References Cited

U.S. PATENT DOCUMENTS

| 2004/0061043 | A1* | 4/2004 | Kline | G01F 23/0061 |
| | | | | 250/227.21 |
| 2006/0106547 | A1 | 5/2006 | Szela et al. | |
| 2006/0207322 | A1* | 9/2006 | Krufka | G01F 23/263 |
| | | | | 73/304 C |
| 2008/0229820 | A1 | 9/2008 | Naydenov | |
| 2009/0071245 | A1* | 3/2009 | Harazin | G01F 23/266 |
| | | | | 73/290 R |
| 2009/0301188 | A1* | 12/2009 | Calcote | G01F 23/265 |
| | | | | 73/304 C |
| 2012/0043976 | A1* | 2/2012 | Bokma | H03K 17/955 |
| | | | | 324/679 |

FOREIGN PATENT DOCUMENTS

| EP | 2270445 A1 | 1/2011 |
| JP | 2007278968 | 10/2007 |
| JP | 2010025815 A | 2/2010 |

\* cited by examiner

CAPACITIVE LIQUID LEVEL SENSOR

CLAIM FOR PRIORITY

This application claims priority under 35 USC 371 to International Application No. PCT/GB2011/051488, filed on Aug. 5, 2011, which claims priority to British Application No. 1015009.2, filed Sep. 9, 2010, each of which is hereby incorporated by reference in its entirety.

The present invention relates to the detection of liquids and in particular, but not exclusively, to the detection of the surface of a liquid utilising a capacitive sensor.

Methods of capacitive sensing are well known in the art whereby a change in capacitance of a sensor can be utilised to detect a change in the sensor environment. This technology has many applications such as touch screen or stylus user interfaces for computers and mobile devices. In addition, capacitive sensing has also found application in the field of chemical analysis and patient diagnosis and in particular for analysing liquid assays. Such assays typically comprise, for example, test tubes or vials into which liquid samples (e.g. biological or chemical samples) have been loaded. When performing such an analysis typically a probe is inserted into the liquid container of the assay which extracts a pre-determined quantity of liquid from the container for analysis.

It is important to be able to be able to detect and control how far the probe is entered into the liquid in order that the quantity of liquid extracted can be sufficiently well controlled. Further, it is desirable to minimise cross contamination between samples and also to facilitate cleaning of the probe tip. In order to minimise said contamination the probe should ideally be maintained only a short distance beneath the surface of the liquid while the liquid is extracted. To control the position of the probe relative to the surface of the liquid it is necessary to have some way to detect when the surface of the liquid is reached by the probe.

Various methods have been proposed in the art utilising capacitive sensing to detect the meniscus (or uppermost surface) of a liquid in a container utilising a capacitive probe.

For example, U.S. Pat. No. 5,493,922 describes a sensor which detects the surface of a liquid in a container when the amplitude of a constant frequency signal generated by a frequency oscillator circuit couple to a sensor changes from a first value to a second value.

U.S. Pat. No. 7,150,190 discloses a sensor arranged to detect the uppermost surface of a liquid by measuring the time taken for a charging capacitive probe to reach a pre-determined threshold voltage and performing an averaging operation in order to confirm the stability of the measurement over a period of time.

U.S. Pat. No. 5,365,783 discloses a capacitive sensor circuit in which a capacitive sensor is used to monitor the capacitance between a probe inserted into a container of liquid and the liquid and further comprises a peak detector for detecting peaks in the capacitance which are utilised to derive the position of the probe with respect to the liquid surface level.

U.S. Pat. No. 5,437,184 discloses a capacitive liquid level sensor which measures any change in phase between measured signals at both of the capacitive plates of a capacitive sensory array (i.e. a probe) and utilizes the measured phase change to determine whether the probe is exposed to a liquid.

However, these known techniques all suffer from the problem that the detectable change in the capacitance of the probe when exposed to liquid is very low. The present inventors have found that the difference between the capacitance of a probe in air and when in contact with a liquid can be as low as 1%. In addition, electrical disturbances or other environmental conditions, for example, a change in temperature, can cause an appreciable change in the capacitance of the probe. In the case of electrical disturbances where fluctuations in capacitance are only seen randomly and for a short period of time (i.e. one or two sampling periods) a detection system can erroneously indicate that liquid is detected even when it is not present. Further, in the case of a change in environmental conditions, where the probe capacitance could be offset for a substantial period of time, a problem arises in any system utilising a fixed reference point upon which detection of the liquid was based because the system will either not indicate that liquid is detected even when the probe is in liquid or always indicate the detection of liquid even when the probe is in air.

In order to overcome these problems, in accordance with the present invention, there is provided a capacitive liquid level sensor comprising a capacitive probe having a capacitance and comprising a sensing tip wherein the capacitive probe is operable to change capacitance when the sensing tip is exposed to liquid, signal generator operable to supply an electrical pulse train signal to the capacitive probe said signal being configured such that the probe is alternately charged and discharged when the signal is high or low respectively, a comparator operable to detect an electrical signal across the capacitive probe and to provide a high output signal when the detected signal magnitude is greater than a comparator threshold value and a low output signal when the detected signal magnitude is less than the comparator threshold value, a timer operable to receive an output signal from the comparator and operable to calculate a time period starting when the comparator output signal goes high and ending when the comparator output signal goes low and liquid detection means operable to utilise the time period calculated by the timing means to determine if liquid is present.

Thus, the presently claimed invention does not directly utilise the rise time, the amplitude or phase of the waveform across the probe as the probe is alternately charged and discharged to perform liquid detection. In contrast, it comprises a threshold based system in which the period of time at which the electric signal, measured across the capacitive probe, is above the threshold is utilised to detect whether the sensing tip of the probe is exposed to liquid. In particular, as the voltage (or other measured electrical parameter) across the capacitive probe crosses the threshold on the way up as it charges and the output of the comparator goes high triggering the timing means to start a timing action. When the pulse train signal provided by the signal generator goes low the capacitive probe begins to discharge and the threshold is crossed again on the way down at which point the timing means stops the timing action. This has the advantage of giving a holistic view of the signal, which includes a section of the charging time, all of the time when the amplitude of the voltage is above a threshold and a section of the discharge time. The measured time period gives an indirect measure of the capacitance of the probe changes in which are indicative of the probe being exposed to liquid.

The liquid detector preferably detects whether liquid is present based on whether the time period calculated by the timer is greater or less than a reference value. The reference value can preferably be adjusted in use to calibrate the sensor according to the operating conditions.

In a further preferred embodiment the sensor additionally comprises averaging means to calculate an average time period of a plurality of time periods calculated by the timer. The average time period is then compared with a reference value to determine whether the sensing tip of the probe has been exposed to liquid. This has the advantage of smoothing out fluctuations caused by short term fluctuations in the capacitance of the capacitive probe that can be caused, for example, by electrical disturbances or noise.

Preferably, the sensor further comprises reference value calibration means which calculates a calibration value equal to an average of a plurality of the average time periods calculated by the averaging means, determine whether the calculated calibration value is equal to the reference value and replace the reference value with the calibration value if it is determined that they are not equal. This has the advantage that the reference value used to determine whether liquid is detected is automatically calibrated by effectively monitoring for trends (ie changes in the average of the average threshold periods) that indicate the need for the reference value to be updated due to a change in environmental or operating conditions and updating the reference value accordingly. Preferably an initial reference value is calculated from a calibration value calculated when the available number of samples is less than the preferred minimum number of average threshold periods. Once the minimum samples threshold is reached previous data is disregarded so that the calculation of the reference value is based only on recent sample data.

In accordance with a further aspect of the present invention there is provided a method of detecting liquid utilising a capacitive probe having a capacitance and comprising a sensing tip wherein the sampling probe is operable to change capacitance when the sensing tip is exposed to liquid, said method comprising, supplying a time varying electrical pulse train signal to the capacitive probe said signal being configured such that the probe is alternately charged and discharged when the signal is high and low respectively; detecting an electrical signal across the capacitive probe and providing a high output signal when the detected signal magnitude is greater than a comparator threshold value and a low output signal when the detected signal magnitude is less than the comparator threshold value; receiving the provided output signal and calculating a time period starting when the output signal goes high and ending when the output signal goes low; and utilising the calculated time period to determine if the sensing tip is exposed to liquid.

Particular embodiments of the present invention will now be described with reference to the accompanying drawings in which.

Throughout the following description the term 'average' is used extensively. As will be appreciated by those skilled in the art, 'average' describes any statistical measure for measuring the central tendency of a set of data including, for example, the mean, median or mode of said data.

Figure 1:
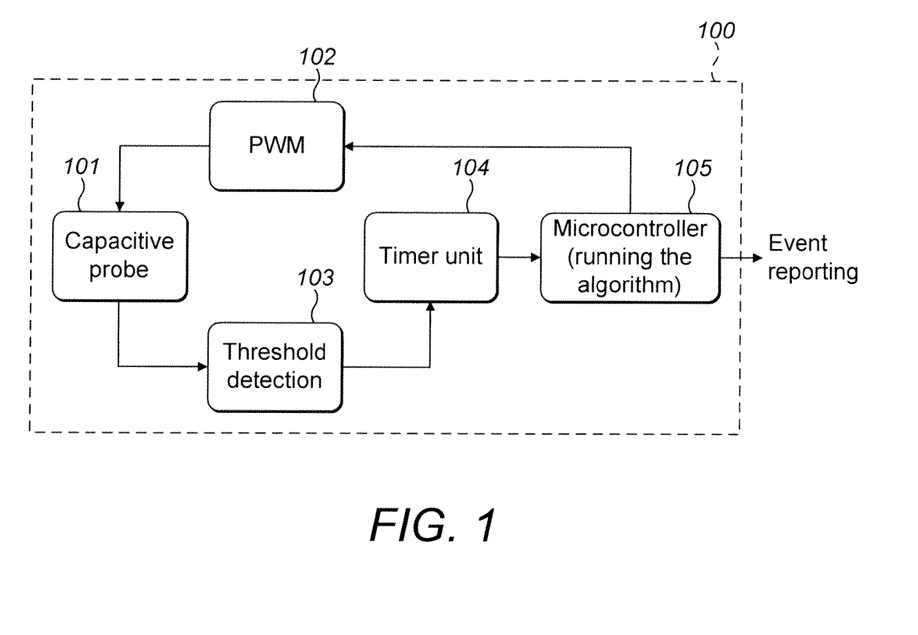
FIG. 1 shows a block diagram of the functional components of a liquid level detection system according to the present invention.

FIG. 1 shows a block diagram of the functional components making up a capacitive liquid sensor in a first embodiment of the present invention. The capacitive liquid sensor includes a capacitive probe 101 that mimics a variable parallel plate capacitor having an exposed section allowing the dielectric to vary depending on the environment the probe is exposed to. The probe is shown in more detail in FIG. 2 from three perspectives 200a, 200b and 200c respectively. The probe 200a, 200b and 200c tapers towards a sensing tip 203 which is shown in greater detail in the close-up view shown in the dashed line labelled as 202. The preceding probe shaft can be seen in more detail in the region enclosed by the dashed line 201 and in this embodiment comprises an AWG Teflon heatshrink tube 208. As can be seen in the close-up view 202, the sensing tip portion 203 is enclosed by the surrounding heatshrink tube 208 and is epoxy bonded in place following assembly. Means for attachment to the sensor and/or diagnostic device is provided by wires 204 soldered to the probe 200a, 200b, 200c at the end remote to the sensing tip 203. Heatshrink 205 binds the wiring neatly to the shaft of the probe and brazed joints 206 are provided at the remote end to reinforce the mechanical connections where appropriate.

Figure 2:
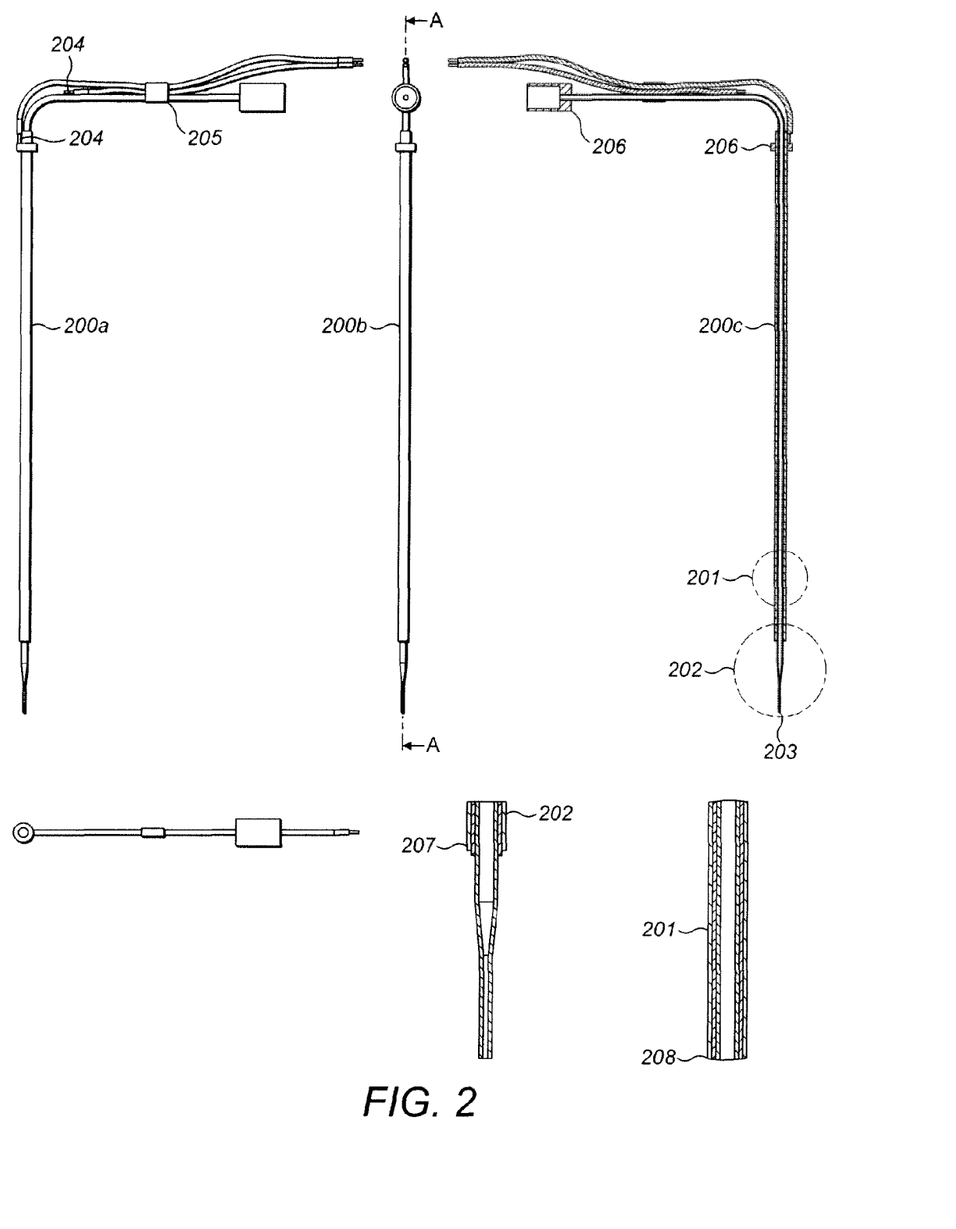
FIG. 2 shows a schematic of the capacitive probe utilised in the system shown in FIG. 1.

The probe is preferably configured such that when used in conjunction with the below described liquid detector it is sensitive enough to record a change in capacitance when the probe enters a volume of liquid in the region of 10 µl.

As shown, the output of a pulse width modulator (PWM) 102 is connected to the capacitive probe 101 and said PWM supplies a voltage modulated pulse train which serves to alternately charge and discharge the capacitive probe 101.

The capacitive probe 101 is connected to a threshold detector 103 which is operable to detect the voltage across the capacitive probe as it is alternately charged and discharged by the pulse train signal and generate a high voltage output signal when the voltage across the probe is above a threshold. The output of the threshold detector is then fed to a timer unit 104 which utilises a split time register to measure the time from which it detects a rising edge from the output of the threshold detector 103 until it detects a falling edge from the output of the threshold detector 103. The measured time period gives a measure of how long the voltage across the probe was above the threshold. As will be described in more detail below said time gives a measure of the capacitance of the probe 101.

Both the timer unit 104 and the PWM 102 are connected to a microcontroller 105 (or other suitably configured microprocessing means) which runs an algorithm controlling the PWM 102, the timer 104 and stores and analyses signals received from the timer 104 to perform the liquid detection. Further, the output of the microcontroller 105 is optionally connected to other internal systems of for example a diagnostics analyser in which the detector is embedded.

Figure 3:
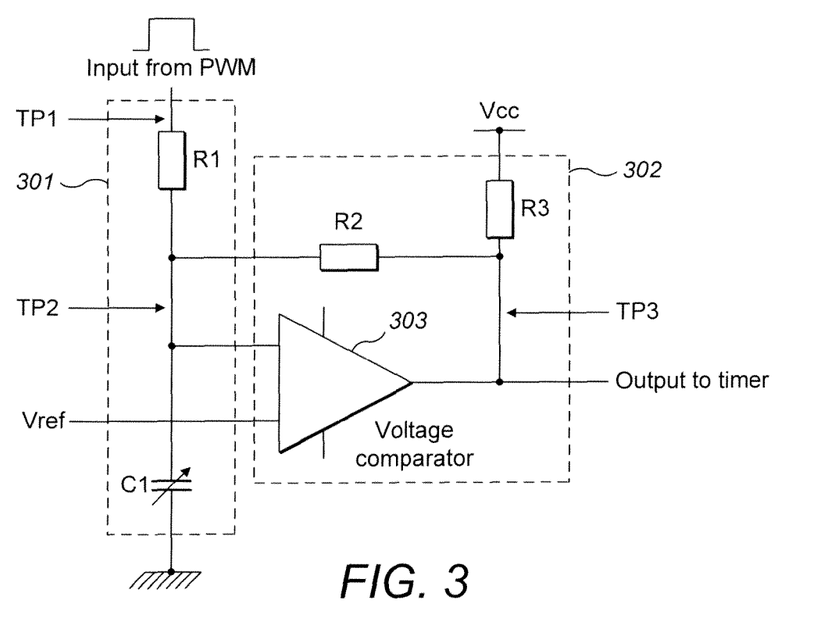
FIG. 3 shows a circuit diagram of a comparator circuit utilised in the threshold detection module shown in FIG. 1.

Turning now to FIG. 3, a circuit diagram is shown which illustrates a preferred circuit for the threshold detector 103 of FIG. 1.

The PWM 102 is configured to provide pulses having a voltage magnitude of $V_{cc}$ through an RC network 301 which comprises a resistance R1 connected in series with the capacitive probe (represented by the variable capacitor C1). When the signal supplied by the PWM signal is equal to rail voltage $V_{cc}$ the capacitive probe C1 begins to charge. The capacitor continues charging until the supplied signal transitions to 0V at which point there is 0V across the RC network 301 and thus C1 is allowed to discharge through a further resistor R2 forming part of a voltage comparator circuit 302. The resistor R2 is connected provided as a feedback resistor to an operational amplifier 303 (performing as a comparator) connected from the output of the op-amp back to the op-amp input. A further resistor R3 is connected between the op-amp output and a voltage rail having the voltage $V_{cc}$. The other op-amp input is connected to a reference voltage which may be set, for example, by a further voltage rail or by means of a variable or fixed potential divider sub-circuit connected to the voltage rail $V_{cc}$. The combination of R2, R3 and the op-amp 303 form a voltage comparator circuit. The output of the voltage comparator is high when the voltage measured across C1 (i.e. the capacitive probe) is greater than the reference voltage $V_{ref}$ and is low when the voltage across C1 is less than the reference voltage $V_{ref}$. The reference voltage $V_{ref}$ is preferably adjustable by, for example, means of a variable resistance or impedance network. Example values of the resistors which would be suitable for implementing the invention are R1=100 Kohms, R2=1 Mohm & R3=330 ohms.

The above describe voltage comparator op-amp is preferably configured to demonstrate hysteresis (i.e. switches on a lower voltage on a falling edge than on a rising edge) in order that the comparator does not erroneously switch on and off due to, for example, noise in the measurements.

Figure 4:
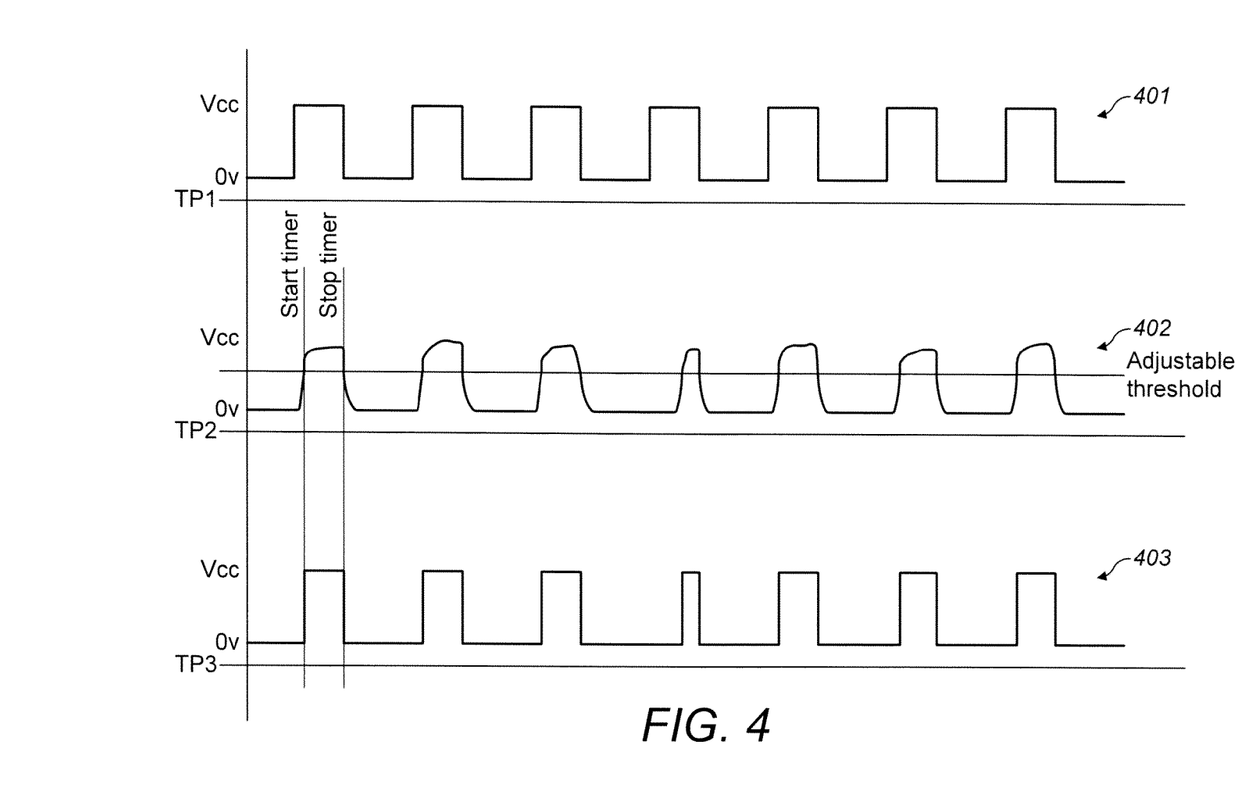
FIG. 4 shows a timing diagram showing the voltage measured at the test points indicated in FIG. 3 when a pulse train is applied to the comparator circuit.

A number of test points are shown in FIG. 3 denoted by TP1, TP2 and TP3 which correspond to the input from the PWM, the voltage across the capacitive probe C1 and output voltage of the comparator circuit 303 respectively. A timing diagram showing the voltage at the test points TP1, TP2 and TP3 against time are shown in FIG. 4.

The uppermost plot 401 shows the PWM voltage signal plotted against time. The PWM 102 is configured by the microcontroller 105 to generate the desired pulse train waveform that allows the charging and discharging of the capacitive probe to occur. The parameters of the PWM waveform can preferably be changed on the fly while the detector is in use.

The timer 104 is configured by the microcontroller 105 to clear the split time register and start timing on detecting the rising edge of the waveform generated by the voltage comparator. On detecting the falling edge of the waveform generated by the voltage comparator the timer value is written into the split time register and an interrupt is generated which is sent to the microcontroller 105. The timer continues until the next rising edge is detected and at this point the end time register is written, the split register cleared and the timer restarts. Thus, the period that the voltage across the capacitive probe is above the threshold is measured and recorded (which we shall refer to as a threshold period in the following description).

The middle plot 402 shows the voltage across the capacitive probe plotted against time and a horizontal line showing the value of the adjustable voltage threshold. In this example the capacitance of the probe increases with time before decreasing again. This change in capacitance could be indicative of the detection of a liquid by the probe. As shown, when the capacitance increases the time for the probe to charge and discharge increases and therefore the time for which the voltage is above the threshold value is reduced.

The lower plot 403 shows the corresponding output of the voltage comparator 302 which goes high when the voltage of plot 402 is above the threshold and low when it is below the threshold. As expected when the capacitance of the probe increases (as a result of a detection event), the charge time increases and, therefore, the pulse width (ie time period) output by the voltage comparator 302 decreases.

The algorithm performed by the microcontroller to analyse the time periods provided by the timer unit is triggered when the interrupt is received by the microcontroller 105. When the desired number of threshold periods has been received the microcontroller calculates an average threshold period. The average threshold period is compared with a reference value and if it lies outside of a range (for example ±1%) of the reference value then it is determined that a change in capacitance large enough to indicate that the probe has been exposed to liquid has occurred. Before the detection is performed, however, the algorithm performs an auto-calibration routine to determine if the reference value against which the average threshold period is to be compared is valid and if it is invalid then it is replace with an auto-calibrated value generated as part of the auto-calibration algorithm. If a valid change is detected an event flag is raised by the microcontroller which can be transmitted to internal systems of for example the diagnostics analyser in which the detector is embedded.

Figure 5:
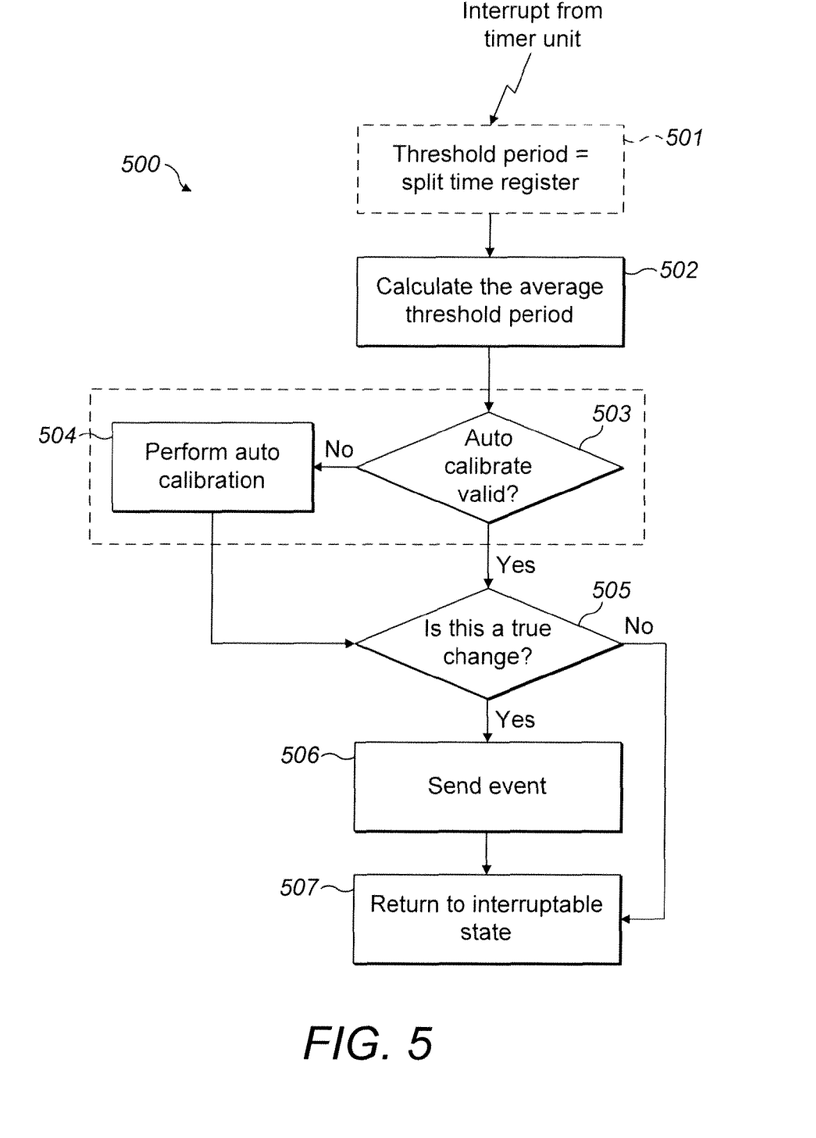
FIG. 5 shows a flow chart of an algorithm performed by the microcontroller of FIG. 1 for detecting whether a change in capacitance has been detected that is indicative of the probe being exposed to liquid.

The steps of the detection algorithm performed by the microcontroller 105 are shown in the flow chart of FIG. 5.

As set out in step 501 of the flow chart 500 upon receiving an interrupt from the timer unit 104 a threshold period is retrieved from the split time register and stored by the microcontroller. Next, at step 502, the microcontroller calculates an average threshold period provided there have been enough threshold periods received from the timer 104 in order to perform a meaningful calculation. Once the average threshold period has been calculated the microcontroller then calculates an auto-calibration value that is an average of a number of average threshold periods and determines whether the reference value is valid by comparison with the auto-calibration value (step 503). In the case where the reference value is not valid it is auto-calibrated by replacing it with the calculated auto-calibration value (step 504). The processing carried out by auto-calibration steps 503 and 504 will be described in more detail below.

After either the reference value is determined valid at step 503 or auto-calibration is performed as in step 504 then the algorithm determines at step 505 if there has been a valid change in capacitance that would be indicative of the probe being exposed to liquid. It is determined that a valid change has occurred if the received average time period is not equal to the reference value and falls outside of a range of the reference value. In a preferred embodiment the range is ±1% of the reference value but as will be appreciated other ranges could be used that suitably calibrate the detector. If a valid change is detected this is recorded as an event and the event is sent on by the microcontroller to a suitable sub-system of the diagnostics device in which the detector is embedded (step 506). The microcontroller is then returned to an interruptible state (step 507). If there has been no valid change detected then the microcontroller is returned directly from step 505 to the interruptible state at step 507.

Figure 6:
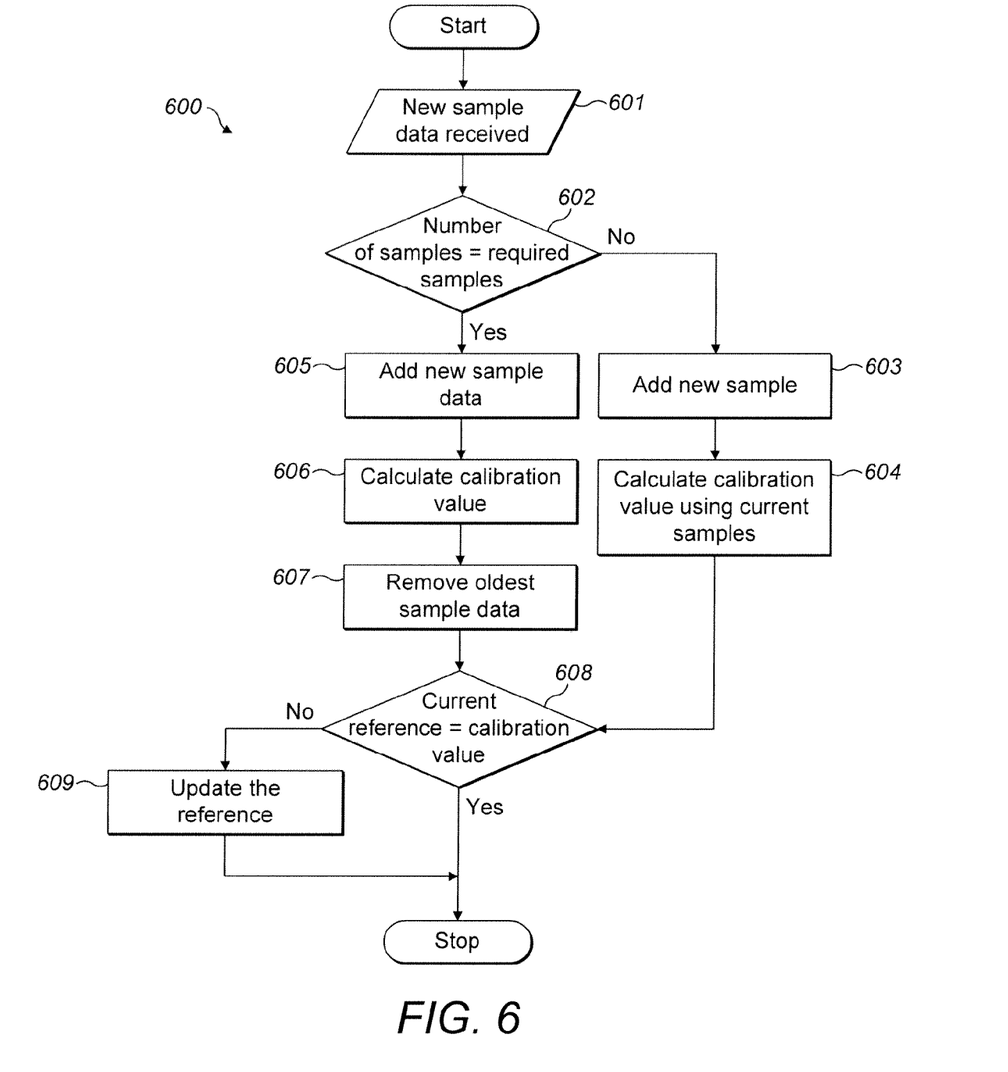
FIG. 6 shows a flow chart of an algorithm performed by the microcontroller of FIG. 1 for performing the auto-calibration step set out in FIG. 5.

The processes performed during the auto-calibration steps of 503 and 504 as set out in FIG. 5 will now be explained in more detail with reference to FIG. 6.

Throughout the day there might be a change in atmospheric conditions in the laboratory or premises where the probe was being operated. The change in conditions would cause a small change to the capacitance of the probe and could result in false triggering. In order to combat this, an auto-calibration algorithm is run before the detection step is performed at step 505 of FIG. 5. The auto-calibration algorithm is capable to generate either a value by averaging a number of average threshold periods fewer than a required number of samples for use as an initial auto-calibration/ reference point or by averaging a larger number of average threshold periods equal to the required number of samples to generate a calibration value utilised to determine whether there is a need to update the reference value. This routine eliminates the problems associated with changes in capacitance caused by changes in, for example, environmental conditions.

In a first step 601 new data is received in the form of the latest average threshold period calculated in step 502. Then in step 602 a determination is made as to whether a number of average threshold periods stored by the microcontroller is greater than a required number of samples threshold value. If it is determined that the number of samples stored is less than the required number of samples then the method moves to step 603 whereby the new sample data is stored. Then in step 604 an initial calibration value is calculated. The calculation of the calibration value is performed by calculating the average (e.g. the mean) of the average threshold values presently stored.

If in step 602 it is determined that the number of samples stored by the microcontroller is equal to the required number of samples then the process moves on to step 605. In step 605 the newly measured average threshold period is stored by the microcontroller in memory together with the previous measurements of the average threshold. Then in step 606 a calibration value is calculated as an average of the average thresholds stored in memory. Once the calculation is complete, in step 607, the oldest average threshold period stored in memory is deleted thus ensuring that the number of average threshold periods utilised is always the same and thus old measurements of the average threshold period do not skew the calibration value when there has been a short or medium term change in the environmental conditions.

After either step 607 or step 604 processing continues at step 608. Here, a determination is made as to whether the currently utilised reference value is equal to the calibration value calculated in either step 606 or step 604 respectively. If the reference value is not equal to the calibration value then the reference value is substituted with the calculated calibration value and the algorithm returns to step 505 of the flow chart shown in FIG. 5. However, the reference value is equal then the algorithm ends and returns to step 505 with no update of the reference value taking place. The alternate branches allow an initial reference value to be determined even when there are not enough sample periods to generate a more meaningful calibration. On the first sample period the reference value will be equal to the average threshold period and, therefore, no meaningful liquid detection will be possible until at least enough sample periods have been completed to generate more than one average threshold period.

Figure 7:
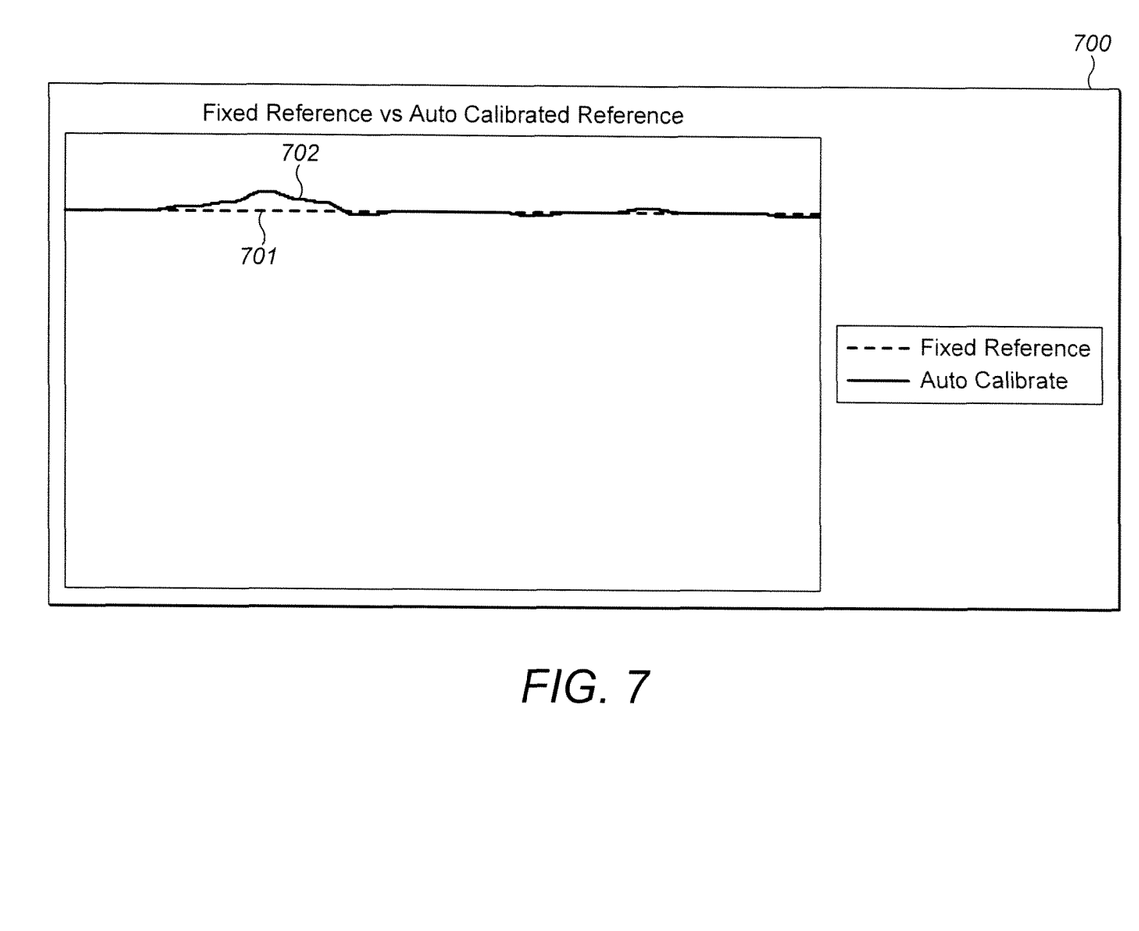
FIG. 7 shows a plot of fixed reference value against a reference value adjusted by the auto-calibration algorithm set out in FIG. 6.

FIG. 7 shows a fixed reference point 701 plotted against a moving reference 702 adjusted by the auto-calibration algorithm described above. As can be seen, the auto-calibrated reference can deviate significantly from the fixed reference value and thereby provide a more accurate detection when the environmental conditions of the detector change.

In the above described embodiments the threshold detection is performed by means of a voltage comparator circuit which is operable to compare the voltage measured across the capacitive probe with a predetermined reference voltage. In an alternative embodiment the threshold detector comprises a current sensing circuit which is operable to measure the current across the probe and compare the measured value with a reference in order to determine whether the current crossed a predetermined threshold. The period of time in which the current exceeds the threshold would be measured by the timer and utilised as a measure of the capacitance of the probe in order to determine whether the sampling tip of the probe is exposed to liquid.

In the above described embodiments the functional components of the detector according to the present invention have been described as being embodied in a diagnostics device. However, it is equally envisaged that the detector could be manufactured and sold as a separate physical entity independently from any diagnostics apparatus with which it may find application.

In the above embodiments, the signal comparison is performed utilising a voltage comparator circuit but as will be appreciated other types of circuit could be used comparing other properties of the detected electrical signal across the capacitor such as a current comparator circuit or any other known electrical comparator.

The above embodiments have been described in terms of the timer, threshold detector and PWM being implemented by peripherals or internal/external circuitry controlled by the microcontroller. The invention could equally be performed, however, with the functionality of any of the timer, threshold detector or the PWM being performed by computer software executed by the microcontroller together with the signal processing algorithms set out in FIGS. 6 and 7 or other processing means. Further, the invention also extends to computer programs on or in a carrier adapted for putting the invention into practice. The program may be in the form of source or object code or in any other form suitable for use in the implementation of the processes according to the invention. The carrier can be any entity or device capable of carrying the program.

For example, the carrier may comprise a storage medium such as a ROM, for example a CD/DVD ROM or a semiconductor ROM, or a magnetic recording medium, for example a floppy disc or a hard disc. Further, the carrier may be a transmissible carrier such as an electrical or optical signal which may be conveyed via electrical or optical cable, wirelessly or by other means.

When a program is embodied in a signal which may be conveyed directly by a cable or other device or means, the carrier may be constituted by such cable or other device or means.

Alternatively, the carrier may be an integrated circuit in which the program is embedded, the integrated circuit being adapted for performing, or for use in the performance of the relevant processes.

The invention claimed is:
1. A capacitive liquid level sensor comprising:
a capacitive probe having a capacitance and comprising a sensing tip wherein the capacitive probe is configured such that the capacitance of the probe changes when the sensing tip is exposed to liquid;
a signal generator configured to supply an electrical signal alternating between a high and low state to the capacitive probe the electrical signal being configured such that the probe is alternately charged and discharged when the signal is high or low respectively;

a comparator configured to detect the magnitude of an electrical signal across the capacitive probe and provide a first output signal value when the detected signal magnitude is greater than a predetermined threshold value and a second output signal value when the signal magnitude is less than the threshold value;

a timer configured to receive an output signal from the comparator and to measure a time period starting when the comparator output signal transitions to the first output signal value and ending when the comparator output signal transitions to the second output signal value; and liquid detector configured to directly utilise the time period measured by the timer to determine if the sensing tip is exposed to liquid.

2. A capacitive liquid level sensor according to claim 1 wherein said liquid detector determines whether the sensing tip is exposed to liquid based on whether the time period measured by the timer is greater or less than a reference value.

3. A capacitive liquid level sensor according to claim 1 further comprising time period average configured to calculate an average time period from a plurality of time periods calculated by the timer; and wherein the liquid detector is configured to determine whether liquid is present based on whether the average time period calculated by the time period average is greater than a reference value.

4. A capacitive liquid level sensor according to claim 3 further comprising reference value calibrator configured to:

calculate a calibration value equal to an average of a plurality of average time periods calculated by the time period average;

determine whether the calibration value is equal to the reference value; and replace the reference value with the calibration value if it is determined that they are not equal.

5. A capacitive liquid level sensor according to claim 4 wherein the reference value calibrator is configured to perform a calibration when the number of average time periods is equal to or greater than a number of samples threshold value.

6. A capacitive liquid level sensor according to claim 5 wherein the reference calibrator is configured to perform the calibration utilising a number of samples equal to the number of samples threshold value.

7. A capacitive liquid level sensor according to claim 4 wherein the reference value calibrator is configured to calculate an initial reference value based on a number of average time periods less than the number of samples threshold value.

8. A capacitive liquid level sensor according to claim 1 wherein the comparator threshold value is adjustable.

9. A capacitive liquid level sensor according to claim 8 further comprising a variable resistance and wherein the comparator threshold value is adjustable by automatically or manually adjusting the resistance value of the variable resistor.

10. A capacitive liquid level sensor according to claim 2 wherein the liquid detector determines that the sensing tip is exposed to liquid when the time period or average time period is outside a range of ±1% of the reference value.

11. A capacitive liquid level sensor according to claim 1 wherein the capacitive probe is configured to have a capacitive sensitivity such that a change in capacitance of the probe is detectable when it is placed within at least 10 µl of liquid.

12. A capacitive liquid level sensor according to claim 1 wherein the signal generator wherein said comparator comprises a voltage comparator and said electrical signal detected across the capacitive probe is a voltage.

13. A capacitive liquid level sensor according to claim 1 wherein the alternating signal comprises an electrical pulse train and the signal generator is preferably a pulse width modulation signal generator.

14. A capacitive liquid level sensor according to claim 13 wherein the signal generator is configured such that in use the timing resolution of the pulse train signal can be adjusted.

15. A capacitive liquid level sensor according to claim 1 wherein said timer comprises a split time register.

16. A method of detecting liquid utilising a capacitive probe having a capacitance and comprising a sensing tip wherein the capacitive probe is configured such that the capacitance of the probe changes when the sensing tip is exposed to liquid, said method comprising:

supplying an electrical signal alternating between a high and low state to the capacitive probe the electrical signal being configured such that the probe is alternately charged and discharged when the signal is high or low respectively;

detecting the magnitude of an electrical signal across the capacitive probe and providing a first output signal value when the detected signal magnitude is greater than a predetermined threshold value and a second output signal value when the signal magnitude is less than the threshold value;

receiving the first or second output signal and measuring a time period starting when the output signal transitions to the first output signal value and ending when the output signal transitions to the second output signal value; and directly utilising the measured time period to determine if the sensing tip is exposed to liquid.

17. A method according to claim 16 wherein the determination on whether the sensing tip is exposed to liquid comprises determining whether the measured time period is greater or less than a reference value.

18. A method according to claim 16 further comprising calculating an average time period from a plurality of calculated time periods; and wherein the determination on whether the sensing tip is exposed to liquid comprises determining whether the calculated average time period is greater than a reference value.

19. A method according to claim 16 further comprising a calibration step comprising:

calculating a calibration value equal to an average of a plurality of average time periods;

determining whether the calibration value is equal to the reference value; and replacing the reference value with the calibration value if it is determined that they are not equal or within a predetermined range.

20. A method according to claim 19 wherein the calibration step is performed when the number of average time periods is greater than a number of samples threshold value.

21. A method according to claim 20 wherein the calibration step comprises utilising a number of samples equal to the number of samples threshold value.

22. A method according to claim 19 wherein the calibration step further comprises calculating an initial reference value utilising a number of average time periods less than the number of samples threshold value.

23. A method according to claim 16 further comprising adjusting the threshold value manually or automatically while performing said method.

24. A method according to claim 23 further comprising wherein the threshold value is adjusted by adjusting the resistance value of a variable resistor connected to the capacitive probe.

25. A method according to claim 17 wherein the determination on whether the sensing tip is exposed to liquid is based on whether time period or average time period is outside a range of, for example, ±1% of the reference value.

26. A method according to claim 16 comprising utilising a capacitive probe configured to have a capacitive sensitivity such that a change in capacitance of the probe is detectable when it is placed within at least 10 µl of liquid.

27. A method according to claim 16 wherein said electrical signal detected across the capacitive probe is a voltage and said comparator threshold is a threshold voltage.

28. A method according to claim 16 wherein the alternating signal comprises an electrical pulse train and the electrical pulse train is pulse width modulated.

29. A method according to claim 16 wherein a timing resolution of the alternating signal is adjusted while the method is being performed.

30. A method according to claim 16 wherein said period of time is calculated utilising a split time register.

* * * * *